(12) United States Patent
Tolsma et al.

(10) Patent No.: US 7,259,828 B2
(45) Date of Patent: Aug. 21, 2007

(54) ALIGNMENT SYSTEM AND METHOD AND DEVICE MANUFACTURED THEREBY

(75) Inventors: Hoite Pieter Theodoor Tolsma, Eindhoven (NL); Ramon Navarro Y Koren, Veldhoven (NL); Hubertus Johannes Gertrudus Simons, Venlo (NL); Remi Daniel Marie Edart, Veldhoven (NL); Pui Leng Lam, Veldhoven (NL); Bernardus Johannes Antonius Hulshof, Veldhoven (NL); Roland Adrianus Emanuel Maria Bogers, Mierlo (NL)

(73) Assignee: ASML Netherlands B.V. (NL)

( * ) Notice: Subject to any disclaimer, the term of this patent is extended or adjusted under 35 U.S.C. 154(b) by 152 days.

(21) Appl. No.: 10/845,516

(22) Filed: May 14, 2004

(65) Prior Publication Data

US 2005/0254030 A1    Nov. 17, 2005

(51) Int. Cl.
G03B 27/32 (2006.01)
G03B 27/42 (2006.01)
G03B 27/52 (2006.01)

(52) U.S. Cl. .............................. 355/40; 355/53; 355/77

(58) Field of Classification Search ................. 355/40, 355/53, 55, 77
See application file for complete search history.

(56) References Cited

U.S. PATENT DOCUMENTS

| 4,778,275 A | 10/1988 | van den Brink et al. |
| 6,383,888 B1 * | 5/2002 | Stirton ........................ 438/401 |
| 6,963,389 B2 * | 11/2005 | Fukada ........................ 355/53 |

FOREIGN PATENT DOCUMENTS

WO        98/39689        9/1998

OTHER PUBLICATIONS

Christopher J. Gould, et al., "Advanced process control applied to metal layer overlay process", Data Analysis and Modeling for Process Control, Proc. of SPIE, vol. 5378, pp. 28-37 (Jan. 2004).

* cited by examiner

*Primary Examiner*—Rodney Fuller
(74) *Attorney, Agent, or Firm*—Pillsbury Winthrop Shaw Pittman LLP (57) ABSTRACT

An arrangement for and a method of automatically selecting substrate alignment marks on a substrate in a lithographic apparatus or overlay metrology targets in an overlay metrology apparatus. The apparatus has a processor and a memory connected to the processor. The memory stores locations of one or more sets of substrate alignment marks or overlay metrology targets available for selection and selection rules to select suitable substrate alignment marks or overlay metrology targets from this at least one set. The selection rules are based on experimental or theoretical knowledge about which substrate alignment mark or overlay metrology targets locations are optimal in dependence on one or more selection criteria.

40 Claims, 6 Drawing Sheets

ALIGNMENT SYSTEM AND METHOD AND DEVICE MANUFACTURED THEREBY

BACKGROUND OF THE INVENTION

1. Field of the Invention

The present invention relates generally to alignment systems and more particularly their uses in lithographic apparatus or overlay measurement apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a manufacturing process using such a lithographic projection apparatus, in an imaging step, the pattern is imaged onto the substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4, incorporated herein by reference.

For the above mentioned manufacturing process and especially during the imaging step it is necessary to position the substrate and the mask on respective object tables with a high accuracy with regard to each other. For this purpose alignment marks are provided on the substrate and in the mask. An alignment system such as described for example in WO 98/39689 or U.S. Pat. No. 4,778,275 incorporated herein by reference, can be used to align a mark in the mask with respect to a corresponding mark on the substrate. If a mark on a substrate is not correctly aligned to the corresponding reference point in the mask this alignment error will cause an error in the super-positioning of two images exposed on successive layers on the substrate. This error in the super-positioning of two images is generally called an overlay error. If a large overlay error occurs, the substrate or a device finally cut out of the substrate may be rejected during a quality inspection. The overlay error is determined in an overlay measurement apparatus by measuring the shift of overlay metrology targets. One part of each target is printed in a first layer. Another part of each target is printed in a second layer or in an adjacent image in the first layer. The overlay error at a specific location of the substrate is equal to the shift between the two printed parts of the target.

One of the first steps that is accomplished when a new substrate is to be manufactured in a lithographic projection apparatus is that alignment marks are exposed on the first layer of resist on the substrate. These marks will be used for aligning the subsequent images to be exposed in subsequent layers of resist on the substrate. The deposition of additional layers and the processing necessary to finish off these subsequent layers may affect the alignment mark such that the alignment mark appears to be shifted in the plane of the substrate. This may cause overlay errors between layers on the substrate. One trend in the industry to reduce such overlay errors is to expose more alignment marks in higher resist layers on the substrate, that are aligned themselves with the alignment marks in the first resist layer. These alignment marks in higher resist layers are, then, used for alignment purposes in these higher resist layers and above.

In each resist layer there may be many such alignment marks, e.g., 100 or even more. Not all these alignment marks will be used since not all of them are, e.g., suitable to be used or using them all will take too much time without improving the accuracy of the measurement significantly. Therefore, two or more suitable alignment marks have to be selected from the set of marks in each resist layer. In the past, e.g., 2 mark pairs (a mark pair is a combination of an X mark and a Y mark located substantially close together, that can be used to determine both X and Y position) per resist layer were used for alignment purposes. Nowadays, the industry is moving to measuring more alignment marks on the substrate to get more accurate information about the actual position of the substrate on the wafer stage and about it's actual shape. In a dual stage machine, e.g., 16 mark pairs may be used without overall throughput impact. This information will be used during exposure to achieve best overlay to the layer in which the marks are exposed.

A still further trend in the industry is that alignment marks are used which are exposed in scribelines between product dies. These alignment marks are exposed with the product and the overlay metrology targets in one lithography step.

Consequence of these two trends is that alignment marks are present in a periodic X,Y pattern on the substrate at fixed positions with respect to a centre of all images. Operators or process engineers of the lithographic apparatus have the task to select a sub-set out off all these alignment marks present on the substrate, which sub-set meets certain predetermined criteria. However, these operators are confronted with several problems:

They need to have a method to select alignment marks exposed at the same location of a physical image on the substrate over multiple layers. This does not mean that they want to align on the same mark over these multiple layers. As explained above, nowadays, most operators expose a new mark after some process steps with a small offset in the scribeline close to a previous mark in a lower resist layer on which they have aligned.

They need to select a set of mark pairs (X-mark and Y-mark=1 pair) which will give them the best overlay out of all marks available on the substrate. Depending on an underlying wafer deformation model some mark distribution models are possible.

A special problem is Wafer Capture. In the phase of Wafer Capture, the rotation of the substrate is not well known and the X and Y mark (which are in different scribelines) which form a X-Y mark pair need to be as close as possible, while the mark pairs themselves should be apart as far as possible.

Moreover, a generic problem for operators is that they need to optimize a selected mark-layout for best overlay and also for maximum productivity. This means that the time needed to measure all marks need to be as short as possible in order to reduce loss of throughput. Thus, operators should optimize a selected alignment mark layout on the substrate and have to have all the knowledge to find the optimum set for 1) overlay, 2) productivity and 3) robustness (i.e., reliability).

SUMMARY OF THE INVENTION

Therefore, one aspect of an embodiment of the present invention to simplify the process of selecting a suitable set of mark pairs among a predetermined set of alignment marks.

To that end, the invention provides an arrangement for automatically selecting alignment marks on a substrate in a lithographic apparatus, comprising a processor and a memory connected to the processor, the memory storing locations of at least one set of substrate alignment marks available for selection and selection rules to select suitable substrate alignment marks from this at least one set, the selection rules being based on at least one of experimental and theoretical knowledge about which substrate alignment mark locations are optimal in dependence on one or more selection criteria, the processor being arranged to select the suitable substrate alignment marks by using the selection rules.

Thus, the invention described below supports operators by automating the knowledge and rules that are available. Automation of the process of selecting alignment marks on substrates is especially useful in a situation where recipe creation is frequently performed. Here, "recipe" refers to a file stored in a suitable computer of the lithographic apparatus, comprising all data as to alignment marks, e.g., their locations on the substrate, exposure steps to make them, an alignment model used, etc.

In a first example of the first embodiment, the selection rules are mark based and act on individual marks available on the substrate.

However, in a second example of the first embodiment, the selection rules are field based, i.e., are related to fields of exposure of the lithographic apparatus.

In relation to the first embodiment, the invention also relates to a lithographic apparatus including an illumination system for providing a projection beam of radiation, a support structure for supporting patterning device, the patterning device serving to impart the projection beam with a pattern in its cross-section, a substrate table for holding a substrate, a projection system for projecting the patterned beam onto a target portion of the substrate, a processor and a memory connected to the processor, the memory storing locations of at least one set of substrate alignment marks available for selection and selection rules to select suitable substrate alignment marks from this at least one set, the selection rules being based on at least one of experimental and theoretical knowledge about which substrate alignment mark locations are optimal in dependence on one or more selection criteria, the processor being arranged to select the suitable substrate alignment marks by using the selection rules.

Moreover, in relation to the first embodiment, the invention relates to a method of automatically selecting substrate alignment marks on a substrate in a lithographic apparatus comprising a processor and a memory connected to the processor, the memory storing locations of at least one set of substrate alignment marks available for selection and selection rules to select suitable substrate alignment marks from this at least one set, the selection rules being based on at least one of experimental and theoretical knowledge about which substrate alignment mark locations are optimal in dependence on one or more selection criteria, the method comprising selecting the suitable substrate alignment marks by using the selection rules.

Finally, in relation to the first embodiment, the invention relates to a device manufacturing method including providing a substrate on a substrate table, automatically selecting substrate alignment marks on said substrate in a lithographic apparatus comprising a processor and a memory connected to the processor, the memory storing locations of at least one set of substrate alignment marks available for selection and selection rules to select suitable substrate alignment marks from this at least one set, the selection rules being based on at least one of experimental and theoretical knowledge about which substrate alignment mark locations are optimal in dependence on one or more selection criteria, the method comprising selecting said suitable substrate alignment marks by using said selection rules, detecting said selected substrate alignment marks with a detector, aligning said substrate on said substrate table by using said selected substrate alignment marks, providing a projection beam of radiation using an illumination system, using a patterning device to impart the projection beam with a pattern in its cross-section, and projecting the patterned beam of radiation onto a target portion of the substrate.

Apart from alignment marks, also overlay metrology targets are present in a periodic X,Y pattern on the substrate at fixed positions with respect to a centre of all images. Operators of the overlay metrology apparatus have the task to select a sub-set out off all these overlay metrology targets present on the substrate. However, these operators are confronted with several problems:

They need to select a set of overlay metrology targets (the overlay in both X and Y direction are measured on the same target) which will give them an accurate and reliable measurement result, representing the overlay achieved on the substrate. The accuracy and reliability increase by performing more overlay measurements on different overlay metrology targets, while measuring more overlay metrology targets impacts productivity. This means that the time needed to measure the overlay metrology marks should be as short as possible in order to reduce loss of throughput.

The number of overlay metrology targets per field and their location in the field can be constant, e.g., 4 overlay metrology targets per field, or the number of overlay metrology targets and their location can change from field to field, depending on an underlying wafer model. In this case the number of overlay metrology targets to be measured can be reduced, while the accuracy of the measurement is hardly affected, thus increasing productivity.

A special problem is Wafer Capture. During Wafer Capture, the rotation of the substrate is not well known and the overlay metrology targets need to be as far as possible from each other for capture.

Therefore, one aspect of an embodiment of the present invention to simplify the process of selecting a suitable set of overlay metrology targets among a predetermined set of overlay metrology targets.

As one will appreciate, the problem of selecting alignment marks on the substrate out of a set of available marks is nearly identical to the problem of selecting overlay metrology targets. Therefore, in the following, the invention will be mainly described in combination with alignment marks and a lithography apparatus, but the description is equally applicable for overlay metrology targets in combination with an overlay inspection apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PRESENT INVENTION

Embodiments

Figure 1:
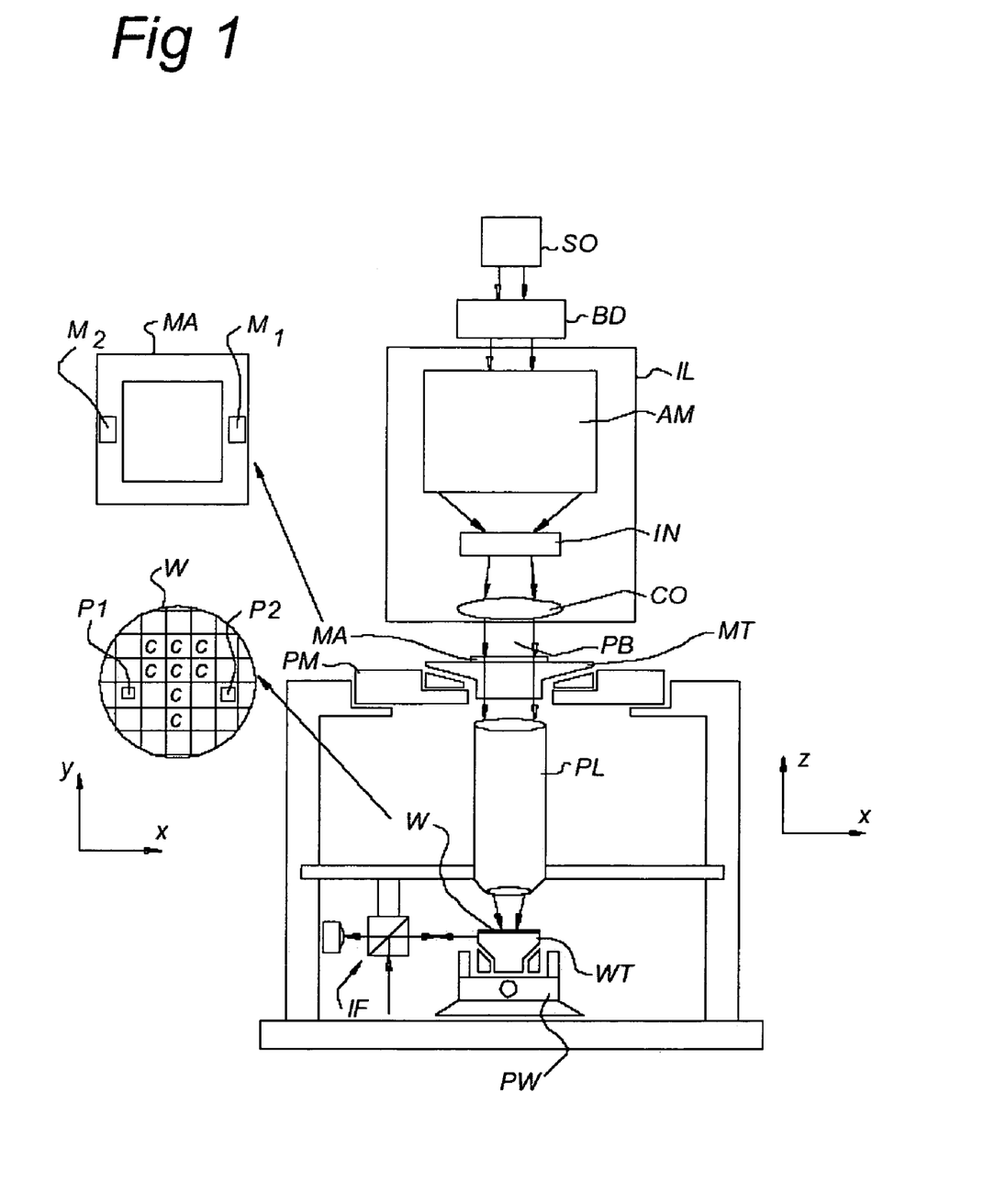
FIG. 1 depicts a lithographic apparatus according to an embodiment of the invention.

FIG. 1 schematically depicts a lithographic apparatus according to a particular embodiment of the invention. The apparatus comprises:

- an illumination system (illuminator) IL for providing a projection beam PB of radiation (e.g., visible light, UV radiation or radiation with even lower frequencies).
- a first support structure (e.g., a mask table) MT for supporting patterning device (e.g., a mask) MA and connected to first positioner PM for accurately positioning the patterning device with respect to item PL;
- a substrate table (e.g., a wafer table) WT for holding a substrate (e.g., a resist-coated wafer) W and connected to second positioner PW for accurately positioning the substrate with respect to item PL; and
- a projection system (e.g., a refractive projection lens) PL for imaging a pattern imparted to the projection beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above). Moreover, the apparatus shown is of a single-stage type. A dual-stage type may be used instead.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical elements AM for adjusting the angular intensity distribution of the beam. Generally, at least the outer and/or inner radial extent (commonly referred to as R-outer and a-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g., an interferometric device), the substrate table WT can be moved accurately, e.g., so as to position different target portions C in the path of the beam PB. Similarly, the first positioner PM and another position sensor (which is not explicitly depicted in FIG. 1) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used, for example, in the following modes:

1. In step mode, the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
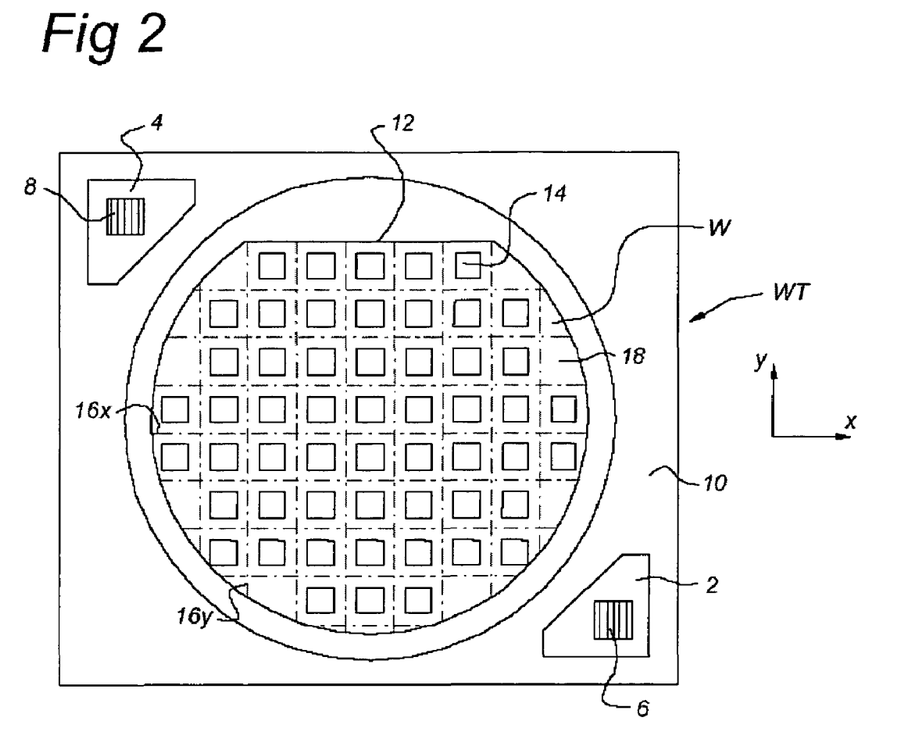
FIG. 2 shows a substrate stage used in an arrangement according to FIG. 1.

FIG. 2 shows an upper view of the substrate table WT, i.e., seen in the direction of the projection beam PB. The substrate table WT supports a substrate W. The substrate table WT comprises at least two substrate table alignment marks 6, 8. They are located on alignment plates 2, 4, respectively. The substrate table alignment marks 6, 8 are shown to comprise gratings. Below the gratings 6, 8 sensors, e.g., photodiodes, are provided as will be explained below with reference to FIG. 4.

Substrate W is generally circularly shaped but is provided with a small flat edge 12 usually called a "flat edge." Instead, notch can be used as is known to persons skilled in the art. The substrate W will be exposed by the lithographic apparatus to produce several identical semiconductor chips. To that the substrate W will be divided in a plurality of dies 14 that are separated from one another by scribelines 16x and 16y, extending in an x and y direction respectively (the y direction being the direction in which the lithographic apparatus makes subsequent exposures on the substrate W). Each die is associated with one semiconductor chip. A plurality of dies may together constitute a field that is defined as an area corresponding to one mask image. The scribelines are the locations where the substrate will be sawn or broken to render the separate chips. There may be portions 18 on the substrate W where no chips are produced since the area is too small.

The flat edge 12 is used to locate the substrate W on the substrate table WT in a so-called "pre-aligner" (not shown) as is known to persons skilled in the art. Instead of a flat edge 12, another physical detectable deviation of the circular shape may be used, like a notch.

Figure 3A:
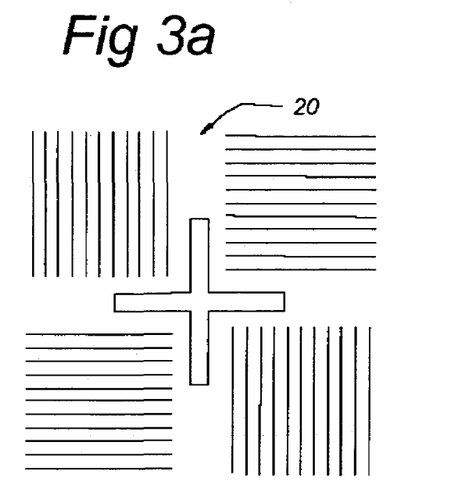
FIGS. 3a and 3b show examples of alignment marks that can be used on a substrate.
Figure 3B:
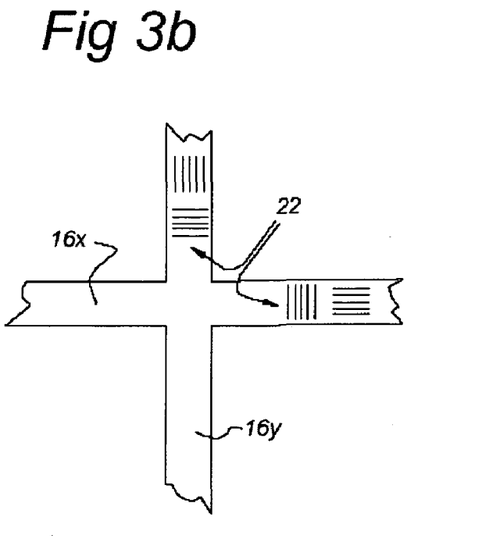

However, the pre-alignment step performed by the pre-aligner is not accurate enough to locate the substrate W on substrate table WT on the exact desired location within the specified tolerances. Therefore, the substrate W is itself provided with several alignment marks, e.g., as identified with reference signs P1, P2 in FIG. 1. These alignment marks may have all kinds of shapes. FIGS. 3a and 3b show some examples. FIG. 3a shows an example of a substrate alignment mark 20 as may be used on portions 18 of substrate W not used for producing chips. FIG. 3b shows examples of substrate alignment marks as may be used in the scribelines 16x, 16y.

Especially in single stage lithographic apparatus, it is common to use 2 or maybe 4 such alignment marks. Then, these substrate alignment marks are directly aligned with mask alignment marks M1, M2 (FIG. 1) on the mask MA, as is e.g., explained in detail in U.S. Pat. No. 4,778,275 and WO98/39689.

However, in order to increase accuracy of alignment, one of the trends in industry is to use more than 2 or 4 alignment marks. This can advantageously be done in dual (or multi) stage lithographic apparatus where a substrate W can be very accurately aligned on the substrate table WT in a stage remote from the exposure stage where there is more time and space for accurate alignment.

Figure 4:
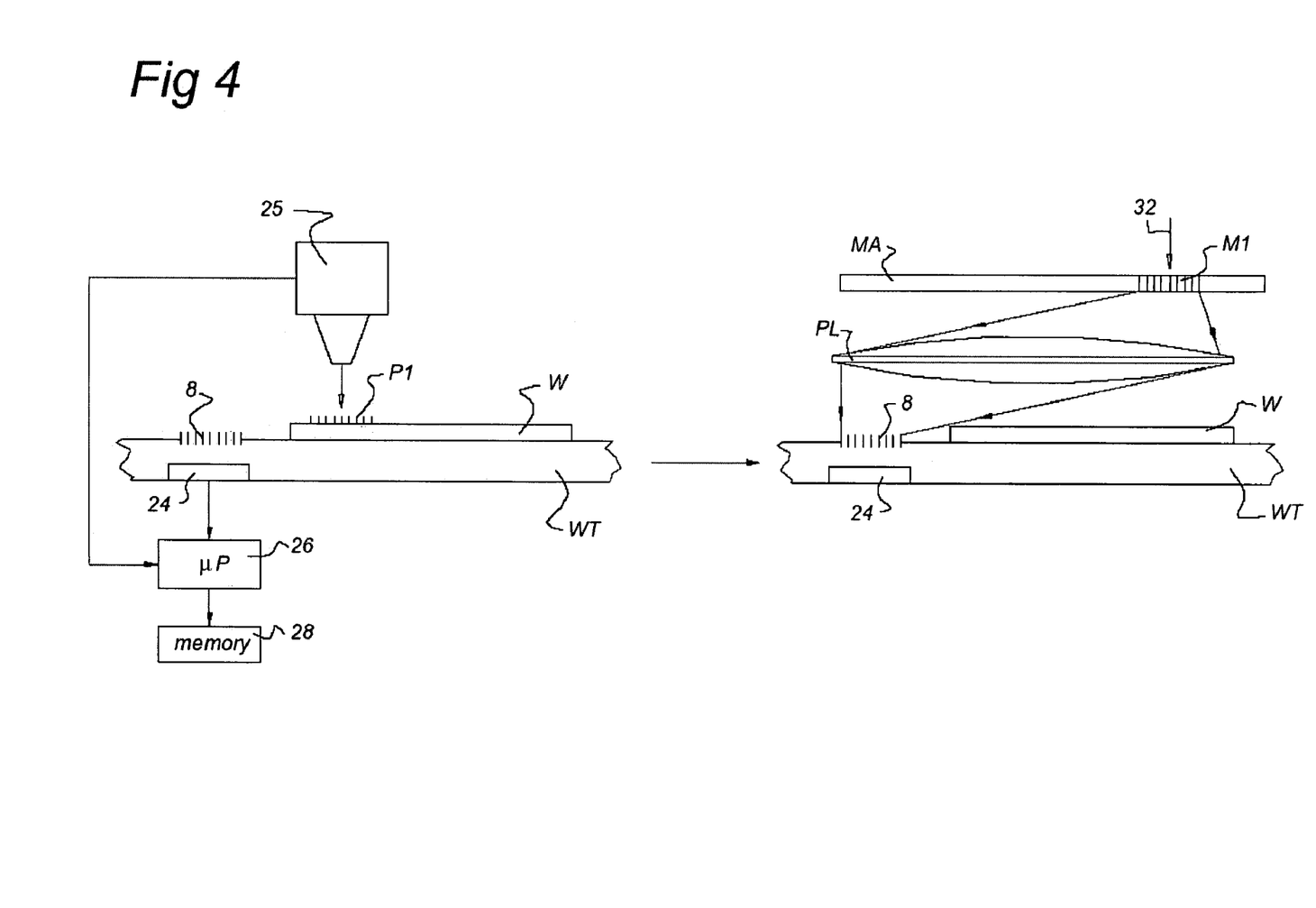
FIG. 4 shows how alignment marks on a substrate and marks on the substrate stage and mask stage can be used to align a substrate and a mask.

Alignment in a dual stage lithographic apparatus will be explained with reference to FIG. 4. FIG. 4 shows two stages, one at the left hand side and one at the right hand side of the Figure. At the left hand side, the stage remote from the exposure stage is shown. At this stage, the substrate W is prepared for exposure, including very accurate alignment on the substrate stage WT. To that end, substrate alignment mark P1 is detected by a suitable detector 25 controlled by a suitable processor 26. Measurements performed by detector 25 are sent to processor 26. The processor 26 is also connected to interferometers (not shown in FIG. 4 but indicated in FIG. 1 by "IF") detecting an exact location of the substrate table WT in the x, y plane. By comparing output of these interferometers and the measurement performed by the detector 25, the processor 26 is able to exactly measure the location of the substrate alignment mark P1. The detector 25 is also used to measure other substrate alignment marks P2 and to send its corresponding measurement results to processor 26. Then, the processor 26 is able to calculate the exact location of the substrate W on substrate table WT by comparing all measurement results from detector 25 with the outputs of interferometers IF. This may be done in two subsequent steps, i.e., a "Wafer Capture" step and a "High Accuracy Wafer Alignment" step. As known to persons skilled in the art, in the Wafer Capture step, an accuracy of ±1 μm may be achieved, whereas in the High Accuracy Wafer Alignment step an accuracy of 1 nm may be achieved.

After being exactly aligned on the substrate table WT the substrate W and the substrate table WT are together moved to the exposure stage, as shown at the right hand side of FIG. 4. At the exposure stage, the substrate table WT and substrate W are below the projection system PL (here shown as a lens). At the exposure stage, the substrate W and substrate table WT need be aligned with the mask MA. To that end, the mask MA is provided with mask marks of which one M1 is shown. To perform this alignment, the mask marks M1, M2 are aligned with the substrate table alignment marks 6, 8. This is enough since the substrate W is already aligned with the substrate table WT. Below the gratings of the substrate table alignment marks, respective photodetectors are provided, of which one 24 is shown. The photodetectors 24 are connected to the processor 26.

To perform the alignment, a beam of radiation 32, that may have the same wavelength as the exposure beam, is directed to the mask mark M1. The beam of radiation 32 is diffracted by the mask mark M1 and imaged onto the substrate alignment mark 8 via the projection system PL. The image may be reduced in size compared to the size of the mask mark M1 as determined by the demultiplication factor of the projection system PL. Depending on the amount of light of the image passing the substrate alignment mark 8 and impinging on the photodetector 24, the processor can conclude whether or not the alignment has finished.

In order to improve accuracy of alignment, the trend in industry is to use more substrate alignment marks P1, P2 than just 2 or 4. A lot of substrate alignment marks P1, P2 are nowadays available. They may be exposed in the scribelines between the product dies such that they are available in a periodic x, y pattern on the substrate at fixed positions with respect to a centre of all images. In many semiconductor devices, a new set of substrate alignment marks P1, P2 is exposed in resist after some process steps. The new set of substrate alignment marks is slightly offset with respect to a set of alignment marks in an earlier layer to which they are aligned. In each layer there may be as many as 100 substrate alignment marks or more.

Operators of a lithographic apparatus have to select a set of alignment mark pairs, each pair having a substrate alignment mark in a scribeline 16x and one in a scribeline 16y. Nowadays, this is a manual process. The operator uses his experience and rules of thumb to select the best set of substrate alignment pairs. To that end, e.g., a monitor (not shown) shows the operator all possible alignment marks he may select. By clicking with a mouse (not shown) the operator may inform the processor 26 of his selection. His selection is determined by an expected overlay. It is very important to have a stable and accurate grid (x, y system) on the substrate W. This x, y grid may change during processing, e.g., due to temperature changes. This is sometimes expressed in a so-called RTE model (RTE=Rotation, Translation, Expansion) of the substrate W. Also different (higher order) models describing the wafer shape more accurate are sometimes used.

Important considerations to select suitable substrate alignment marks may be derived from a substrate deformation model, resulting in one or more suitable mark distribution models, i.e., sets of substrate alignment marks that are suitable to be used. A substrate deformation model comprises rules for deformation of an image of a mark or the substrate on which the marks are printed in dependence on process steps performed after the mark was exposed. For example, a layer may be laid down on the mark, which influences a path of propagation of detector light used by detector 25 to detect the mark, resulting in an incorrect detection of the location of the mark (e.g., of the lines of a grating constituting the mark). Much research is nowadays carried out to better understand incorrect detection of locations of marks due to subsequent process steps. Reference is, e.g., made to U.S. Patent Publication No. 2002147520, and C. J. Gould, e.a., "*Advanced Process Control Applied to Metal Layer Overlay Process*," SPIE_5378-4, 22 Jan. 2004.

In accordance with the invention, at least one set of substrate alignment marks available for selection and selection rules to select suitable substrate alignment mark pairs from this at least one set are stored in memory 28. The selection rules are based on experimental and theoretical knowledge about which substrate alignment mark locations and, possibly, which number of desired mark pairs are optimal in dependence on one or more selection criteria. Such a criterion may be best possible overlay. However, selecting based on best achievable overlay may take too much time and result in loss of throughput. Therefore, in an embodiment, a set of rules is applied that selects a set of substrate alignment mark pairs that is optimal with respect to throughput given a predetermined overlay requirement. On the other hand, in an other embodiment, a set of selection rules may be used that selects a set of substrate alignment mark pairs that is optimal with respect to overlay given a predetermined throughput requirement. The number of sets of selection rules is not fixed. It depends on design choices. Moreover, in any of the sets of rules there may be parameters that can be manually determined by an operator. If so, the processor 26 will ask the operator, e.g., via a monitor (not shown), to input desired parameter values. Such parameters may be or relate to overlay and throughput. Substrate deformation models may be used to define the selection rules.

The mechanism of selection of alignment marks based on a pre-defined wafer deformation model can also be applied for the selection of overlay metrology targets. For these overlay metrology targets, the accuracy of wafer shape modeling depends on the layout of the overlay metrology targets over the substrate, e.g., to measure field scaling and rotation, multiple overlay metrology targets per exposed field should be measured. Typically 4 overlay metrology targets per field are measured on the 4 corners of the field.

Examples of selection rules for alignment marks are:

mark based selection: here, a set of selection rules (or algorithms) is used which act on individual marks available on the substrate W. The set of selection rules does not have a priory knowledge of the fields in which the marks are once exposed on the substrate.

field based selection: here, a set of selection rules is used which act primarily on the fields in which the marks are once exposed on the substrate. After selecting one or more optimal fields, all (or a set) of substrate alignment marks associated with each optimal field are used for alignment. Benefits from these selection rules are that substrate alignment marks associated with the same field over two or more layers are used, although the individual marks used can be different from layer-to-layer due to re-definition of marks in a higher process layer and that individual alignment mark positions are linked to their position in the field and thus field properties, like field scaling and field rotation can be determined.

Figure 5:
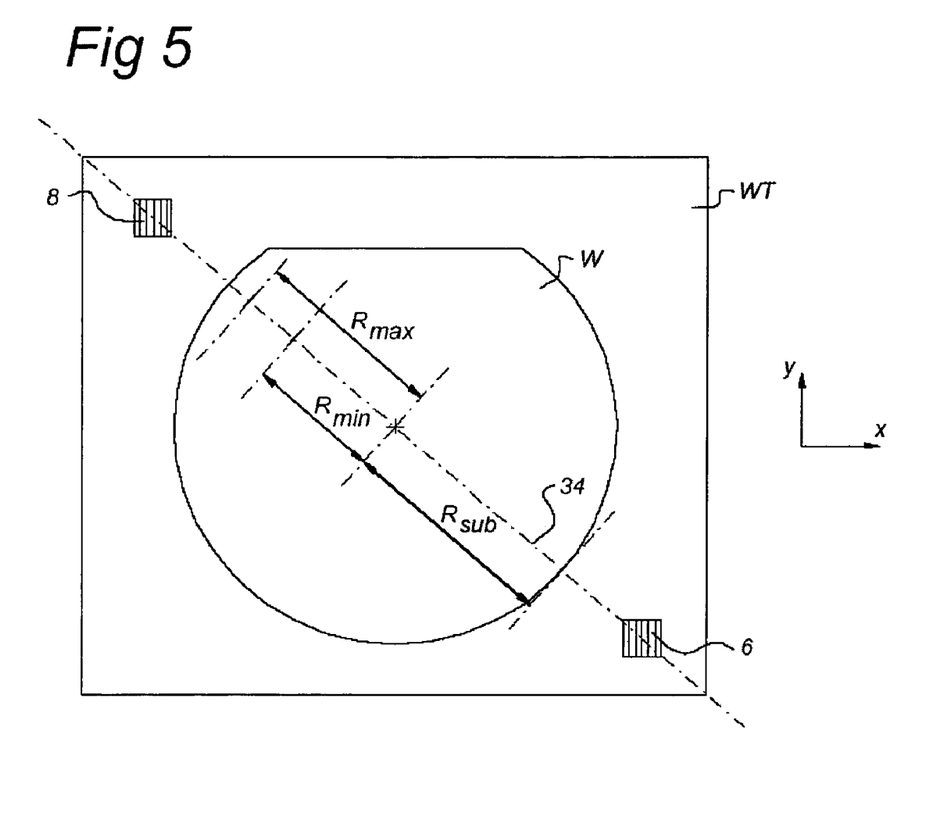
FIG. 5 shows a substrate on a substrate table to explain use of selection rules.

These two selection rules will now be explained in more detail with reference alignment marks and to FIG. 5.

Mark Based Rules

Mark based rules may be using one of the following layouts:
1. Wafer Capture layout
2. Circle layout
3. Uniform layout Wafer Capture Layout The mark based rules can advantageously be used during the Wafer Capture of a substrate W on a substrate table WT. The following characteristics are applicable:

the selection rules are mark based. The distance between a substrate alignment mark in an x scribeline 16x and one in an y scribeline 16y forming a pair together shall be minimized. A small distance between an X and Y mark of an XY-pair ensures robustness of the modeling algorithm in case of initial large substrate rotation when loading the substrate on the substrate table WT.

a predetermined number, e.g., 4, of mark pairs will be selected as close as possible to a diagonal 34 through substrate table alignment marks 6, 8 for productivity reasons, i.e., to meet predetermined throughput requirements. This predetermined number may be fixed but, alternatively, be an input parameter received from an operator. The predetermined number of mark pairs may be in groups of 2. The concept of having groups of a first and a second mark pair at each target location is that the second pair may serve as a back-up mark pair in case one or two marks fail on alignment.

substrate alignment marks should be outside a minimum radius Rmin. Again, this parameter may be fixed or may be an input parameter to be received from an operator. If the parameter Rmin is an input parameter it may have a default value between 30% and 90%, e.g., 70% of the substrate radius Rsub. The concept of having the substrate alignment marks outside a radius of, e.g., 70% of Rsub is to measure the substrate rotation with high accuracy, although the positions of the individual marks are not known with extreme high accuracy.

substrate alignment marks should never be outside a maximum radius Rmax. Again, this parameter may be fixed or may be an input parameter to be received from an operator. If the parameter Rmax is an input parameter it may have a default value between 50% and 100%, e.g., 95% of the substrate radius Rsub. The concept of having the marks not outside the outer radius Rmax is to be less sensitive to processing inhomogeneities at the edge of the substrate.

The marks are selected outside a minimum radius Rmin and inside a maximum radius Rmax as close as possible to diagonal 34. Therefore, the marks will be positioned substantially centred with respect to the centre of the substrate. Based on theoretical analysis and simulations this centred layout improves both reliability and accuracy, which is also supported by empirical data. The fact that in this layout the measurements have to be extrapolated least with respect to other layouts is perceived to be a key factor.

Circle Layout

In the circle layout the following characteristics are applicable:

selected marks should be as close as possible to a target radius. The target radius may be an input parameter, the value of which is to be input by an operator. A default target radius may be between 30% and 90%, e.g., 70% of Rsub. The concept of having the substrate alignment marks as close as possible to the target radius is to align on marks at the location on the substrate which is known from experiments to have minimum deformation due to processing. From a theoretical point of view the enclosed substrate area of a circle of 70% of Rsub is equal to the substrate area outside this circle, thus balancing interpolated and extrapolated areas. At the same time the maximum extrapolation distance (30% of Rsub) is much smaller than the maximum interpolation distance (70% of Rsub), thus compensating for the superior accuracy of interpolation over extrapolation.

selected marks can either be placed 1) in a symmetrical pattern on the substrate with mirror symmetry in X and or Y direction, or 2) in a configuration such that as many X and Y co-ordinates are covered on the substrate. The symmetrical layout will result in more stable modelled substrate parameters given a finite accuracy of the individually measured marks. The many X-Y co-ordinates layout will average out calibration and drift errors in the wafer table WT positioning system.

selected marks should never be outside a maximum radius. Again, the maximum radius may be an input parameter. A suitable default value may be between 50% and 100%, e.g., 90% of Rsub. The concept of having the marks not outside this radius is that marks at the substrate edge are more deformed due to process inhomogeneities. Note that at, or around, the location of the flat edge of the substrate or substrate notch it may be necessary to use a reduced maximum radius or to use an exclusion zone around the flat edge of the substrate or substrate notch where marks cannot be selected, especially if the wafer number is located in that area.

selected marks should be homogeneously angularly distributed across the substrate W. In an homogeneously angularly distributed circle layout all measured marks contribute equally to the wafer model parameters (especially substrate rotation and substrate expansion), while in other layouts the marks located to the outside of the distribution dominate in effect on substrate rotation and substrate expansion over marks located to the inside of the distribution.

number of selected marks may be input by an operator, or may be predetermined, or calculated, e.g., using accuracy optimization without impact on the maximum productivity.

the mark(s) in the centre of the circle distribution can be added as an extra measurement as this mark, located at the substrate centre, suffers least from process effect causing mark asymmetry due to its point symmetric location on the substrate.

Uniform Layout

In the uniform layout the following characteristics are applicable:

selected marks should be as far as possible separated from each other. This ensures a uniform spread over the substrate and is especially useful when local substrate deformation is the dominant factor in the wafer model used. These local wafer deformation models can compensate effect of inhomogeneous wafer temperature profiles as well as stress effects in the substrate due to RTP processing. From a theoretical point of view the maximum interpolation distance is lowest for a uniform distribution.

selected marks can either be placed 1) in a symmetrical pattern on the substrate with mirror symmetry in X and or Y direction, or 2) in a configuration such that as many X and Y co-ordinates are covered on the substrate. The symmetrical layout will result in more stable modelled substrate parameters given a finite accuracy of the individually measured marks. The many X-Y co-ordinates layout will average out calibration and drift errors in the wafer table WT positioning system.

selected marks should never be outside a maximum radius. This may be an input parameter with a default value between 50% and 100%, e.g., 90% of Rsub. The concept of having the marks not outside this radius is that marks at the substrate edge are more deformed due to process inhomogeneities. Note that at, or around, the location of the flat edge of the substrate or substrate notch it may be necessary to use a reduced maximum radius or to use an exclusion zone around the flat edge of the substrate or substrate notch where marks cannot be selected, especially if the wafer number is located in that area.

the number of selected marks may be an input parameter specified by an operator, or may be predetermined, or calculated, e.g., using accuracy optimization without impact on the maximum productivity.

The mark based rules are advantageously used in Wafer Capture and High Accuracy Wafer Alignment of the substrate W on the substrate table WT.

Field Based Rules

Field based rules may be using one of the following layouts:
1. circle layout
2. uniform layout Circle Layout In the circle layout the following characteristics are applicable:

the rules are field based. Individual mark positions do not influence the outcome of the selected fields;

selected fields should be as close as possible to a target radius. The target radius may be an input parameter, the value of which is to be input by an operator. A default target radius may be between 30% and 90%, e.g., 70% of Rsub. From a theoretical point of view the enclosed substrate area of a circle of 70% of Rsub is equal to the substrate area outside this circle, thus balancing interpolated and extrapolated areas. At the same time the maximum extrapolation distance (30% of Rsub) is much smaller than the maximum interpolation distance (70% of Rsub), thus compensating for the superior accuracy of interpolation over extrapolation;

selected fields can either be placed 1) in a symmetrical pattern on the substrate with mirror symmetry in X and or Y direction, or 2) in a configuration such that as many X and Y co-ordinates are covered on the substrate. The symmetrical layout will result in more stable modelled substrate parameters given a finite accuracy of the individually measured marks. The many X-Y co-ordinates layout will average out calibration and drift errors in the wafer table WT positioning system;

selected fields should never be outside a maximum radius. Again, the maximum radius may be an input parameter. A suitable default value may be between 50% and 100%, e.g., 90% of Rsub. The concept of having the marks not outside this radius is that marks at the substrate edge are more deformed due to process inhomogeneities. Note that at, or around, the location of the flat edge of the substrate or the substrate notch it may be necessary to use a reduced maximum radius or to use an exclusion zone around the flat edge of the substrate or substrate notch where marks cannot be selected, especially if the wafer number is located in that area;

selected fields should be homogeneously angularly distributed across the substrate W. In an homogeneously angularly distributed circle layout all measured marks contribute equally to the wafer model parameters (especially substrate rotation and substrate expansion), while in other layouts the marks located to the outside of the distribution dominate in effect on substrate rotation and substrate expansion over marks located to the inside of the distribution;

number of selected fields may be input by an operator, or may be predetermined, or calculated, e.g., using accuracy optimization without impact on the maximum productivity;

the field in the centre of the circle distribution can be added as an extra measurement as marks in this field, located at the substrate centre, suffer least from process effect causing mark asymmetry due to their point symmetric location on the substrate.

When the optimal fields are thus determined, the detection of the substrate alignment marks may be done with all substrate alignment marks in all selected fields. However, in an embodiment, it is possible that the processor 26 asks the operator to select suitable substrate alignment marks within the selected fields. Most often the operator limits the selection to alignment marks printed in one layer only. When multiple alignment marks are printed per layer in each field, all marks of the selected fields may be selected, or for productivity reasons a subset thereof can be selected that may be equal for all fields or varying from field to field.

Uniform Layout

In the uniform layout the following characteristics are applicable:

the selection rules are field based. The individual mark positions do not influence the outcome;

selected fields should be as far as possible separated from each other. This ensures a uniform spread over the substrate and is especially useful when local substrate deformation is the dominant factor in the wafer model used. These local wafer deformation models can compensate effects of inhomogeneous substrate temperature profiles as well as stress effects in the substrate due to RTP processing. From a theoretical point of view the maximum interpolation distance is lowest for a uniform distribution;

selected fields can either be placed 1) in a symmetrical pattern on the substrate with mirror symmetry in X and or Y direction, or 2) in a configuration such that as many X and Y co-ordinates are covered on the substrate. The symmetrical layout will result in more stable modelled substrate parameters given a finite accuracy of the individually measured marks. The many X-Y co-ordinates layout will average out calibration and drift errors in the wafer table WT positioning system;

selected fields should never be outside a maximum radius. This may be an input parameter with a default value between 50% and 100%, e.g., 90% of Rsub. The concept of having the marks not outside this radius is that marks at the substrate edge are more deformed due to process inhomogeneities. Note that at, or around, the location of the flat edge of the substrate or substrate notch it may be necessary to use a reduced maximum radius or to use an exclusion zone around the flat edge of the substrate or substrate notch where marks cannot be selected, especially if the wafer number is located in that area;

the number of selected fields may be an input parameter specified by an operator, or may be predetermined, or calculated, e.g., using accuracy optimization without impact on the maximum productivity.

Again, when the optimal fields are thus determined, the detection of the substrate alignment marks may be done with all substrate alignment marks in all selected fields. However, in an embodiment, it is possible that the processor 26 asks the operator to select suitable substrate alignment marks within the selected fields.

The field based rules are advantageously used in High Accuracy Wafer Alignment of the substrate W on the substrate table WT or for metrology verification.

The invention as explained above solves several problems related to the state of the art as to alignment marks:

it guarantees usage of substrate alignment marks linked to one physical die throughout a whole stack of processes related to all layers on the substrate W although the actual used substrate alignment mark used for alignment may be renewed in subsequent layers and thus changed going up through the process stack;

it provides a best set of selected substrate alignment marks depending on the underlying substrate deformation model, taking also productivity into account.;

it provides a combination of pairs of substrate alignment marks in their own x and y scribelines $16x$, $16y$ such that the distance between the two marks is minimized;

it provides fast mark selection.

The selection rules as detailed above are, in general, equally well applicable for overlay metrology targets. Now, a brief description of application to overlay metrology targets will be given with reference to FIGS. 6–8c.

Figure 6:
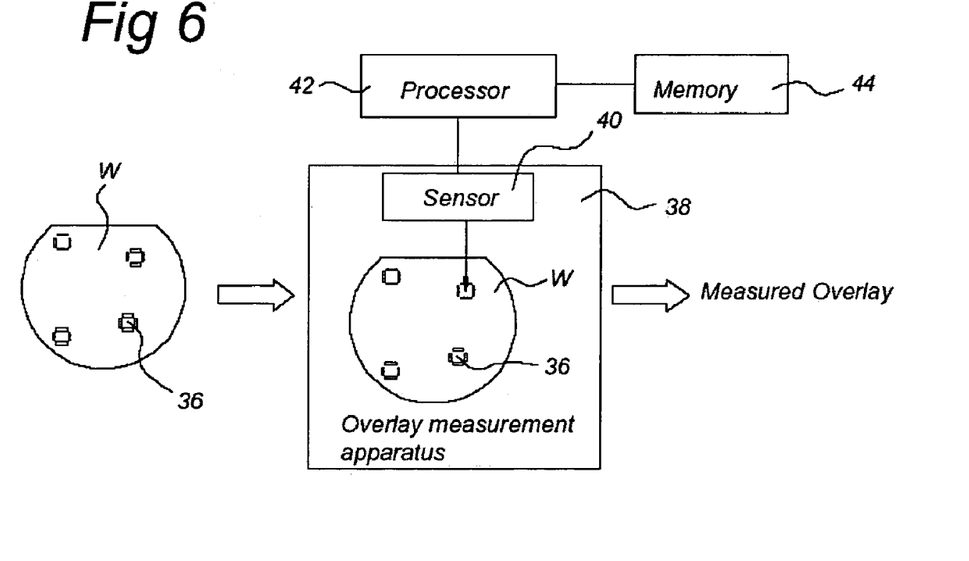
FIG. 6 schematically shows an arrangement for overlay measurement.

FIG. 6 schematically shows an arrangement for overlay measurements. A substrate W, that is provided with overlay metrology targets 36, is provided to an overlay measurement apparatus 38. The overlay measurement apparatus 38 is located outside the lithography system as shown in FIG. 1. The overlay measurement apparatus 38 comprises a sensor 40 that is connected to a processor 42. The processor 42 may be located inside or outside the overlay measurement apparatus 38. The processor 42 is connected to memory 44. The memory 44 stores locations of at least one set of overlay metrology targets available for selection as well as selection rules to select suitable overlay metrology targets from this set. The selection rules are based on experimental and/or theoretical knowledge about which overlay metrology target locations are optimal in dependence on one or more selection criteria.

The sensor 40 is controlled by the processor 42 based on these selection rules (in general, this is done via a "recipe" or "job") and these locations of the overlay metrology targets, and detects the overlay metrology targets 36 and sends a measurement signal to the processor 42 that is arranged to deduce overlay data from that measurement signal. The sensor 40 of FIG. 6 may be an optical CCD image sensor controlled by suitable software stored in memory 44 (or elsewhere) as is known to persons skilled in the art and needs no further explanation.

Figure 7A:
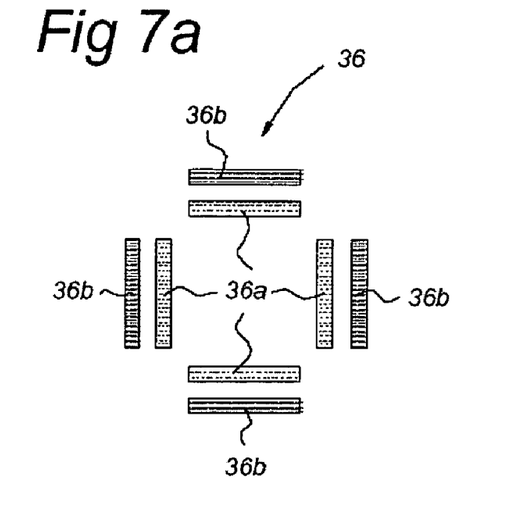
FIGS. 7a–7c schematically show an overlay metrology target.
Figure 7B:
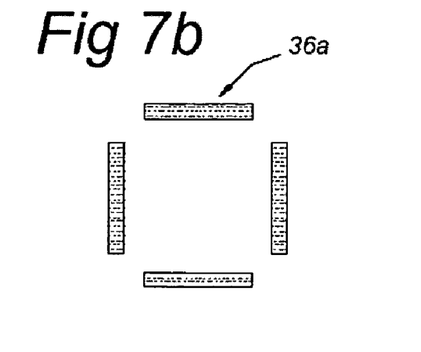
Figure 7C:
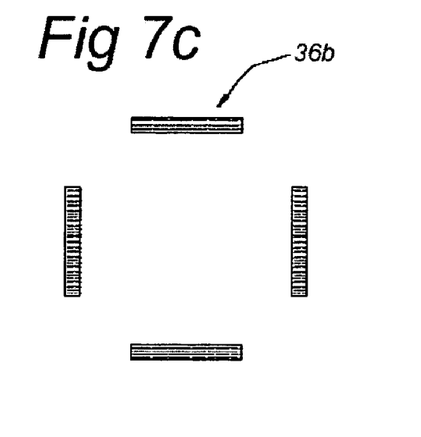

FIG. 7a schematically shows an overlay metrology target 36. The overlay metrology target 36 comprises a first overlay metrology target portion 36a, separately shown in FIG. 7b, that is located in a first layer in the substrate W, e.g., is produced as metal lines in that first layer. The overlay metrology target 36 comprises a second overlay metrology target portion 36b, separately shown in FIG. 7c, that is located in a second layer and that is usually implemented as a pattern in resist on top of the first layer at the time of measurement.

Figure 8A:
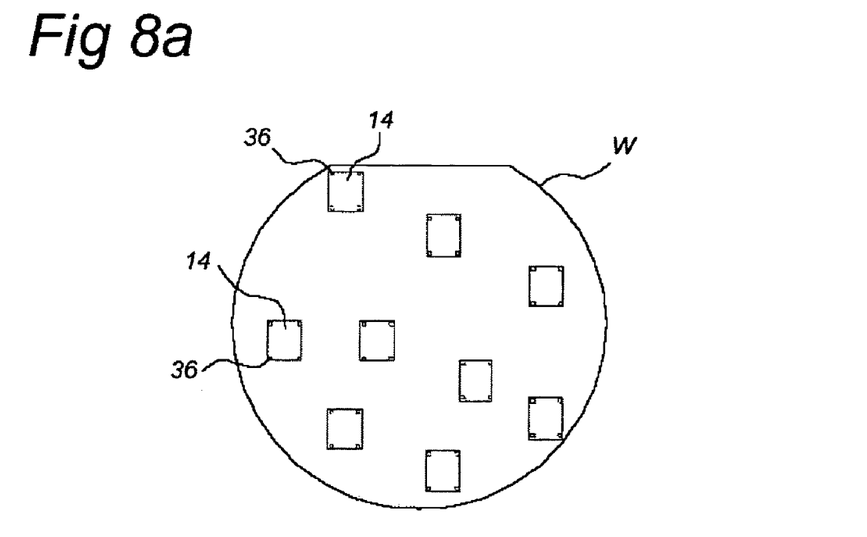
FIG. 8a–8c show some examples of selection rules for overlay metrology targets.
Figure 8B:
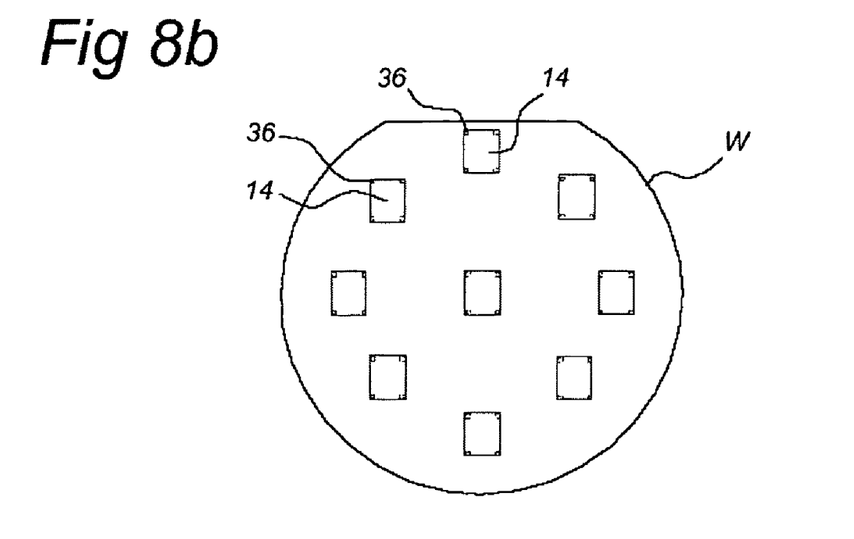
Figure 8C:
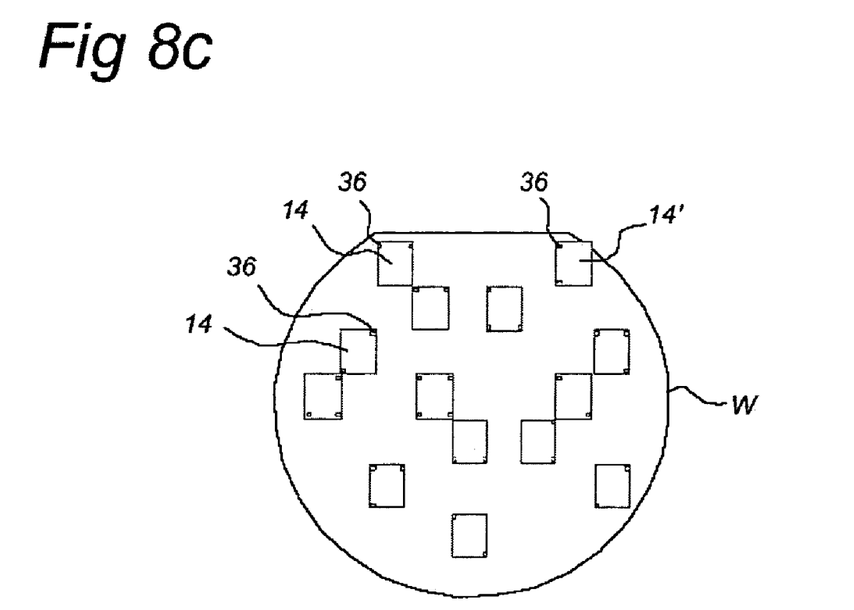

FIGS. 8a, 8b and 8c show examples of selection rules to be applied by the processor 42 when controlling sensor 40 to select only a number of all possible overlay metrology targets available to be used in the overlay measurement. In FIGS. 8a and 8b the selection rules are field based whereas in FIG. 8c the selection rules are target based.

In the arrangement of FIGS. 8a, the selection rules are based on a homogeneous layout, i.e., there is fixed number of overlay metrology targets 36 (in FIG. 8a, this number is 4) per field and the selected fields are homogeneously distributed across the substrate W.

In the arrangement of FIGS. 8b, the selection rules are based on a symmetrical layout, i.e., there is fixed number of overlay metrology targets 36 (in FIG. 8b, this number is 4) per field and the selected fields are symmetrically distributed across the substrate W about a centre of the substrate W.

In the arrangement of FIG. 8c, the selection rules are target based. This is comparable to the mark based selection rules explained above, however the relation between overlay metrology target and the field in which it is exposed is still present here. FIG. 8c shows that in this arrangement it is possible to select overlay metrology targets 36 in a field 14 that is partly outside the substrate radius.

One approach for the target selection rules may be based on more fields but less targets per field than in the field based approach. However, the number of targets 36 to be used may be the same resulting a same measurement time in the overlay measurement apparatus 38. Another approach may be to use as many fields as in the field based approach but with less targets per field, resulting in the possibility of measuring overlay on more substrates W in the same time.

When applying the invention to overlay metrology targets 36, the following problems related to the state of the art of overlay metrology targets 36 are solved:
it guarantees usage of overlay metrology targets linked to one physical die throughout a whole stack of processes related to all layers on the substrate W although the actual used substrate alignment mark used for alignment may be renewed in subsequent layers and thus changed going up through the process stack;
it provides a best set of selected substrate overlay metrology targets representing the achieved overlay depending on the underlying substrate deformation model;
it provides a combination of overlay metrology targets so that both interfield and intrafield parameters can be determined accurately, taking productivity into account;
it provides fast overlay metrology target selection.

While specific embodiments of the invention have been described above, it will be appreciated that the invention may be practiced otherwise than as described. The description is not intended to limit the invention.

For instance, in the embodiments described above, reference is made to one single processor 26. As will be evident to persons skilled in the art, the functions to be performed may be carried out by several processors that may be mutually connected. Moreover, there may be several memories. There may be only a single wafer stage or multiple alignment sensors.

What is claimed is:

1. An arrangement for automatically selecting alignment marks on a substrate in a lithographic apparatus, comprising:
a processor; and
a memory operatively interconnected with the processor, the memory containing machine readable information comprising locations of at least one set of substrate alignment marks available for selection, and selection rules to select suitable substrate alignment marks from this at least one set,
wherein the selection rules are based on at least one of experimental and theoretical information about which substrate alignment mark locations are optimal based on one or more selection criteria, and wherein the processor is configured and arranged to select said suitable substrate alignment marks by using said selection rules.

2. Arrangement according to claim 1, wherein said one or more selection criteria comprise best possible overlay of subsequent layers produced on said substrate by said lithographic apparatus.

3. Arrangement according to claim 1, wherein said one or more selection criteria comprise at least one of productivity of the lithographic apparatus and reliability of the lithographic apparatus.

4. Arrangement according to claim 1, wherein the memory further stores a plurality of sets of selection rules and wherein the processor is arranged to receive instructions from an operator as to which set is to be used.

5. Arrangement according to claim 1, wherein said set of selection rules comprises parameters of which values can be manually determined by an operator.

6. Arrangement according to claim 1, wherein said selection rules are based on a substrate deformation model.

7. Arrangement according to claim 1, wherein said selection rules are mark based and act on individual marks available on the substrate.

8. Arrangement according to claim 7, wherein said selection rules comprise:
selecting a substrate alignment mark in an x scribeline and one in an y scribeline on the substrate that have a minimum distance between them.

9. Arrangement according to claim 8, wherein said selection rules comprise at least one of:
selecting a predetermined number of mark pairs as close as possible to a diagonal through substrate table alignment marks available on a substrate table supporting said substrate;
selecting substrate alignment marks outside a minimum radius on the substrate;
selecting substrate alignment marks such that they are within a maximum radius; and
selecting two substrate alignment marks in an x scribeline and an y scribeline forming a mark pair such that relative positions between them are identical for all mark pairs.

10. Arrangement according to claim 9, wherein said minimum radius is between 30% and 90% of a substrate radius and said maximum radius is between 50 and 100% of said substrate radius.

11. Arrangement according to claim 7, wherein said selection rules comprise:
selecting substrate alignment marks as close as possible to a target radius on the substrate.

12. Arrangement according to claim 11, wherein said selection rules comprise at least one of:
selecting substrate alignment marks within a maximum radius on the substrate;
selecting substrate alignment marks homogeneously angularly distributed across the substrate.

13. Arrangement according to claim 12, wherein said target radius is between 30% and 90% of a substrate radius and said maximum radius is between 50% and 100% of said substrate radius.

14. Arrangement according to claim 11, wherein said selection rules comprise either selecting said substrate alignment marks in a symmetrical pattern on the substrate with mirror symmetry in X and Y directions or in a configuration such that as many X and Y co-ordinates are covered on the substrate.

15. Arrangement according to claim 11, wherein said selection rules comprise selecting a substrate alignment mark in a centre of the substrate.

16. Arrangement according to claim 11, wherein said substrate comprises either a flat edge or a notch, and said selection rules comprise not selecting substrate alignment marks in a predefined zone from said either flat edge or notch.

17. Arrangement according to claim 7, wherein said selection rules comprise:
    selecting substrate alignment marks as far as possible from one another.

18. Arrangement according to claim 17, wherein said selection rules comprise selecting substrate alignment marks within a maximum radius on the substrate, said maximum radius being between 50% and 100% of a substrate radius.

19. Arrangement according to claim 17, wherein said substrate comprises either a flat edge or a notch, and said selection rules comprise not selecting substrate alignment marks in a predefined zone from said either flat edge or notch.

20. Arrangement according to claim 17, wherein said selection rules comprise either selecting said substrate alignment marks in a symmetrical pattern on the substrate with mirror symmetry in X and Y directions or in a configuration such that as many X and Y co-ordinates are covered on the substrate.

21. Arrangement according to claim 1, wherein said selection rules are field-based rules that are related to fields of exposure of the lithographic apparatus.

22. Arrangement according to claim 21, wherein said selection rules comprise:
    selecting fields that are as close as possible to a target radius on the substrate.

23. Arrangement according to claim 22, wherein said selection rules comprise at least one of:
    selecting fields within a maximum radius,
    selecting fields that are homogeneously angularly distributed across the substrate.

24. Arrangement according to claim 23, wherein said target radius is between 30% and 90% of a substrate radius and said maximum radius is between 50% and 100% of said substrate radius.

25. Arrangement according to claim 22, wherein said substrate comprises either a flat edge or a notch, and said selection rules comprise not selecting substrate alignment marks in a predefined zone from said either flat edge or notch.

26. Arrangement according to claim 22, wherein said selection rules comprise either selecting said substrate alignment marks in a symmetrical pattern on the substrate with mirror symmetry in X and Y directions or in a configuration such that as many X and Y co-ordinates are covered on the substrate.

27. Arrangement according to claim 22, wherein said selection rules comprise selecting a field in a centre of the substrate.

28. Arrangement according to claim 21, wherein said selection rules comprise:
    selecting fields that are as far as possible separated from one another.

29. Arrangement according to claim 28, wherein said selection rules comprise selecting fields within a maximum radius, said maximum radius being between 50% and 100% of a substrate radius.

30. Arrangement according to claim 28, wherein said substrate comprises either a flat edge or a notch, and said selection rules comprise not selecting substrate alignment marks in a predefined zone from said either flat edge or notch.

31. Arrangement according to claim 28, wherein said selection rules comprise either selecting said substrate alignment marks in a symmetrical pattern on the substrate with mirror symmetry in X and Y directions or in a configuration such that as many X and Y co-ordinates are covered on the substrate.

32. A lithographic apparatus comprising:
    an illumination system for providing a projection beam of radiation;
    a support structure for supporting a patterning device, the patterning device serving to impart the projection beam with a pattern in its cross-section;
    a substrate table for holding a substrate;
    a projection system for projecting the patterned beam onto a target portion of the substrate;
    a processor; and
    a memory operatively interconnected with the processor, the memory containing machine readable information comprising locations of at least one set of substrate alignment marks available for selection, and selection rules to select suitable substrate alignment marks from this at least one set, wherein the selection rules are based on at least one of experimental and theoretical information about which substrate alignment mark locations are optimal based on one or more selection criteria, and wherein the processor is configured and arranged to select said suitable substrate alignment marks by using said selection rules.

33. Lithographic apparatus according to claim 32, wherein said lithographic apparatus comprises a detector connected to said processor and arranged to detect said selected substrate alignment marks and said lithographic apparatus is arranged to align said substrate on said substrate table by using said selected substrate alignment marks as detected by said detector.

34. A method of automatically selecting substrate alignment marks on a substrate in a lithographic apparatus comprising:
    evaluating selection rules, the rules being based on at least one of experimental and theoretical information regarding which of a group of substrate alignment mark locations are optimal based on one or more selection criteria; and
    selecting suitable substrate alignment marks from at least one set of substrate alignment marks available for selection, based on the evaluated selection rules.

35. A device manufacturing method comprising:
    providing a substrate on a substrate table;
    evaluating selection rules, the rules being based on at least one of experimental and theoretical information regarding which of a group of substrate alignment mark locations are optimal based on one or more selection criteria; and
    selecting suitable substrate alignment marks from a at least one set of substrate alignment marks available for selection, based on the evaluated selection rules;
    detecting said selected substrate alignment marks with a detector;

aligning said substrate on said substrate table by using said selected substrate alignment marks;

providing a projection beam of radiation using an illumination system;

patterning the projection beam with a pattern in its cross-section; and projecting the patterned beam of radiation onto a target portion of the substrate.

36. An arrangement for automatically selecting overlay metrology targets on a substrate in an overlay measurement system, comprising:

a processor; and a memory operatively interconnected with the processor, the memory containing machine readable information comprising locations of at least one set of overlay metrology targets available for selection, and selection rules to select suitable overlay metrology targets from this at least one set, wherein the selection rules are based on at least one of experimental and theoretical information about which overlay metrology target locations are optimal based on one or more selection criteria, and wherein the processor is configured and arranged to select said suitable substrate alignment marks by using said selection rules.

37. Arrangement according to claim 36, wherein said selection rules are target based and act on individual targets available on the substrate.

38. Arrangement according to claim 36, wherein said selection rules are related to fields of exposure of a lithographic apparatus.

39. An overlay measurement system comprising:

a processor; and a memory operatively interconnected with the processor, the memory containing machine readable information comprising locations of at least one set of overlay metrology targets available for selection, and selection rules to select suitable overlay metrology targets from this at least one set, wherein the selection rules are based on at least one of experimental and theoretical knowledge about which overlay metrology target locations are optimal based on one or more selection criteria, and wherein the processor is configured and arranged to select said suitable overlay metrology targets by using said selection rules.

40. A method of automatically selecting overlay metrology targets on a substrate in an overlay measurement system comprising a processor and a memory connected to the processor, the memory storing locations of at least one set of overlay metrology targets available for selection and selection rules to select suitable overlay metrology targets from this at least one set, the selection rules being based on at least one of experimental and theoretical knowledge about which overlay metrology target locations are optimal in dependence on one or more selection criteria, the method comprising selecting said suitable overlay metrology targets by using said selection rules.

* * * * *